(12) United States Patent
Quenzer et al.

(10) Patent No.: US 8,758,590 B2
(45) Date of Patent: Jun. 24, 2014

(54) METHOD FOR TREATING THE SURFACE OF AN ELECTRICALLY CONDUCTING SUBSTRATE SURFACE

(75) Inventors: Hans-Joachim Quenzer, Itzehoe (DE); Gerfried Zwicker, Itzehoe (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 962 days.

(21) Appl. No.: 12/295,321

(22) PCT Filed: Apr. 20, 2007

(86) PCT No.: PCT/EP2007/003497
§ 371 (c)(1),
(2), (4) Date: May 22, 2009

(87) PCT Pub. No.: WO2007/121948
PCT Pub. Date: Nov. 1, 2007

(65) Prior Publication Data
US 2009/0283416 A1  Nov. 19, 2009

(30) Foreign Application Priority Data

Apr. 21, 2006 (DE) .......................... 10 2006 019 189
Jun. 30, 2006 (DE) .......................... 10 2006 030 323

(51) Int. Cl.
*C25D 17/00* (2006.01)
*C25D 5/02* (2006.01)
*B23H 3/00* (2006.01)

(52) U.S. Cl.
USPC ........... 205/686; 205/640; 205/118; 205/136; 204/280; 204/224 M

(58) Field of Classification Search
USPC .................................. 205/640–686; 204/284
See application file for complete search history.

(56) References Cited

U.S. PATENT DOCUMENTS 2,927,042 A * 3/1960 Hayes et al. .................. 427/540
3,653,968 A   4/1972 Louzos
(Continued)

FOREIGN PATENT DOCUMENTS

| DE | PS 21 21 631 | 11/1971 |
|----|--------------|---------|
| EP | 0 712 176 A1 | 12/1993 |
| JP | 58 025488 A  | 2/1983  |
| WO | WO 2005/008783 A1 | 1/2005 |

OTHER PUBLICATIONS definition of absorb. thefreedictonary.com Apr. 11, 2013.*
Industrie-Anzeiger, Essen 87 (1965) pp. 1648-1660.

*Primary Examiner* — Nicholas A Smith
*Assistant Examiner* — Brian W Cohen
(74) *Attorney, Agent, or Firm* — Antonelli, Terry, Stout & Kraus, LLP.

(57) ABSTRACT

Disclosed is a method of treating the surface of an electrically conducting substrate surface wherein a tool comprising an ion-conducting solid material is brought into contact at least in some areas with the substrate surface. The tool conducts the metal ions of the substrate and an electric potential is applied so that an electrical potential gradient is applied between the substrate surface and the tool in such a manner that metal ions are drawn from the substrate surface or deposited onto the substrate surface by means of the tool.

20 Claims, 3 Drawing Sheets

(56) References Cited

U.S. PATENT DOCUMENTS

| | | | |
|---|---|---|---|
| 4,155,735 A * | 5/1979 | Ernsberger | 430/5 |
| 5,034,023 A | 7/1991 | Thompson | |
| 5,795,653 A | 8/1998 | Cuomo et al. | |
| 6,375,823 B1 * | 4/2002 | Matsuda et al. | 205/117 |
| 6,632,337 B2 * | 10/2003 | Platz et al. | 204/280 |
| 7,691,250 B2 * | 4/2010 | Mazur et al. | 205/668 |
| 2002/0197761 A1 | 12/2002 | Patel et al. | |
| 2006/0037856 A1 * | 2/2006 | Bayer et al. | 204/290.01 |
| 2006/0164880 A1 | 7/2006 | Sakamoto et al. | |
| 2007/0215480 A1 * | 9/2007 | Fang et al. | 205/118 |
| 2009/0289371 A1 * | 11/2009 | Sakamoto | 257/773 |

* cited by examiner

METHOD FOR TREATING THE SURFACE OF AN ELECTRICALLY CONDUCTING SUBSTRATE SURFACE

BACKGROUND OF THE INVENTION

1. Field of the Invention

The present invention relates to a method of treating the surface of an electrically conductive, preferably metallic, substrate surface with which micro-structures and nano-structures can be placed in the surface of the substrate. Typical fields of application of such a type method are leveling technical surfaces for producing highly plane surfaces, for example in the form of mirror surfaces or in the production of mechanically, electronically and/or optically effective structures.

2. Description of the Prior Art

Generic methods for treating the surfaces of substrate surfaces, in particular the surfaces of metallic substrate surfaces, are either prior-art material-removal methods, such as for example wet chemical etching techniques or material deposition methods, such as electroplating processes, sputter or vapor deposition processes just to name a few. In all the prior-art methods the objective is to create on a to-be-processed substrate surface the necessary process conditions for the respective process, conditions that in some cases require large, complex, expensive devices. For example, in order to deposit material layers on the surface of a substrate, it is necessary to provide a corresponding vacuum chamber in which certain materials can be deposited on the surface of the substrate. A prerequisite for the use of wet-chemical deposition processes and etching processes is provision of chemical baths in which electrostatic conditions prevail which, apart from the high technical cost and effort, furthermore present safety and disposal problems.

Also prior art are planing methods for leveling the surface of a substrate based on chemo-mechanical polishing, in particular Cu surfaces in micro-electronics. In addition to this, projecting regions of material can be removed using so-called "reverse plating" by reversing electroplating deposition. This method can be employed for leveling material deposits.

SUMMARY OF THE INVENTION

The present invention provides treatment of the surfaces of metallic substrate surfaces with the goal of selectively influencing the properties of the surfaces, that is to structure them in the sense of local material deposition or also local material removal, without the need of complicated, large and expensive devices. In particular, it should be possible to use the method according to the invention to plane substrate surfaces, such as for example in leveling metalized wafers.

Features that advantageously further develop the invention can be found in the description, in particular with reference to the preferred embodiments.

The method of treating the surface of a metallic substrate surface according to the invention utilizes a tool comprising an ion-conducting solid material which is brought into contact at least in some regions with the metallic surface of the substrate. The ion-conducting material of the tool is selected in such a manner that it is able to conduct metal ions of copper, silver or from a silver and copper alloy of the substrate surface preferably without itself undergoing material deposition or agglomeration or any other degradation. Moreover an electrical potential is applied between the substrate surface and the tool so that the metal ions are drawn from the substrate surface by the tool or deposited on the substrate surface by the tool in those regions where the tool comes into contact with the substrate surface.

The method according to the invention thus opens, dependent on the electrical potential applied between the substrate surface and the tool and dependent on selection of the material regarding the substrate and the substrate surface and the tool as well as dependent on the shape of the tool which determines the shape and size of the contact area between the tool and the substrate surface, the possibility of depositing material on the substrate surface or removing material therefrom without the necessity of providing complicated process conditions and the devices needed therefore. Rather the treatment of the surface substrate according to the invention is based on solely electrochemical processes. To increase the efficiency of the method according to the invention, it is most advantageous to conduct the material deposition process and the material agglomeration process, at a temperature above room temperature, which is known as approximately 20-25° C., for example at temperatures of approximately 80° C. because ionic conductivity increases at higher temperatures.

The tool, on which the surface treatment according to the invention of the metallic substrate surface is conducted, is preferably composed of a ion-conducting solid material, which has facing the substrate surface a tool surface which is suitably structured or unstructured, that is plane or smooth, depending on the purpose of the surface treatment. For surface treatment, the tool surface is pressed firmly against the substrate surface forming an intimate surface contact, preferably under application of force. At least the to-be-treated substrate surface is composed of a metal, and comprises parts of a metal, which are able to release metal ions into the ion-conducting tool and is able to accept them therefrom. Then a suitably selected electric voltage is applied between the substrate surface and the rear side of the tool composed of an ion-conducting material. In the case of a cationic ion-conductor in the contact region between the tool and the substrate surface, the electrical voltage leads to emission of metal ions from the metallic substrate surface into the tool composed of an ion-conducting material similar to a galvanic element with liquid electrolytes.

Due to the ion emission at the substrate surface, which is analogous to processes in galvanic systems with soluble anodes, there is continuous material removal, with the substrate being etched locally, that is solely at the tool-contact regions.

As the tool composed of an ion-conducting material is pressed with force against the substrate surface, the tool continuously sinks into the substrate surface as long as the etching process continues, that is as long as the tool is pressed with force against the substrate surface while an electrical potential is applied between the substrate surface and the tool. As already mentioned, in contrast to using liquid electrolytes, etching is only local, and material removal is only in the contact regions, that is in those regions in which the tool is in contact with the substrate surface. It is especially advantageous if the tool composed of an ion-conducting material is able to transport the to-be-etched metal totally without any residue in such a manner that the tool undergoes no change regarding its chemical composition.

If, in contrast to etching, the objective is to deposit metal on the substrate surface in a controlled manner, by reversing the polarity of the applied electric voltage, metal can be deposited from the tool composed of an ion-conducting material on the substrate surface in the contact region. Moreover, by means of the selected amount of electrical potential, it is possible to dictate the amount of the to-be-deposited metal as well as the speed of the metal deposition on the substrate surface. Possibly comparable to so-called pulsed plating are therefore etching processes, that is material-removal processes in which, by using periodic, pulsed waves (instead of a direct electric voltage), which is applied between the substrate surface and the tool, in addition to the etching processes, temporary deposition processes can also occur, however, only in order to be able to control the removal process better.

A particular advantage of the method according to the invention is that material deposition or material removal is basically realizable without the occurrence of reaction-based chemical side-products. But rather the material deposition processes, and material removal processes, are based on the transfer of metal ions between the tool and the substrate surface or in reverse.

If, however as the ion-conducting material, an anionic ion conductor is used as the material of the tool, reactive gases, under circumstances also in atomic form, can occur which lead directly to a chemical reaction at the interface between the tool composed of the ion-conducting material and the electrically conducting substrate surface. If such type reaction products occur in gaseous form, for example when using fluorine ion conductors, this process can be employed for local etching processes as described in a preferred embodiment hereinafter.

BRIEF DESCRIPTION OF THE DRAWINGS

The present invention is made apparent in the following, without the intention of limiting the general overall inventive idea, using preferred embodiments with reference to the accompanying drawings.

DETAILED DESCRIPTION OF THE INVENTION

Figure 1:
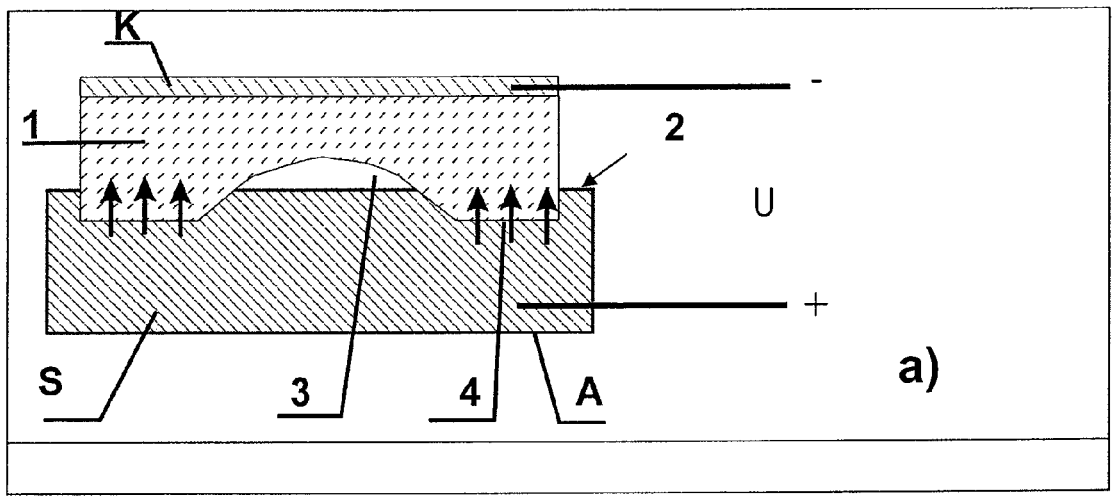
FIGS. 1a and b show preferred embodiments for carrying out the method according to the invention for local removal of material at a substrate surface.
Figure 1:
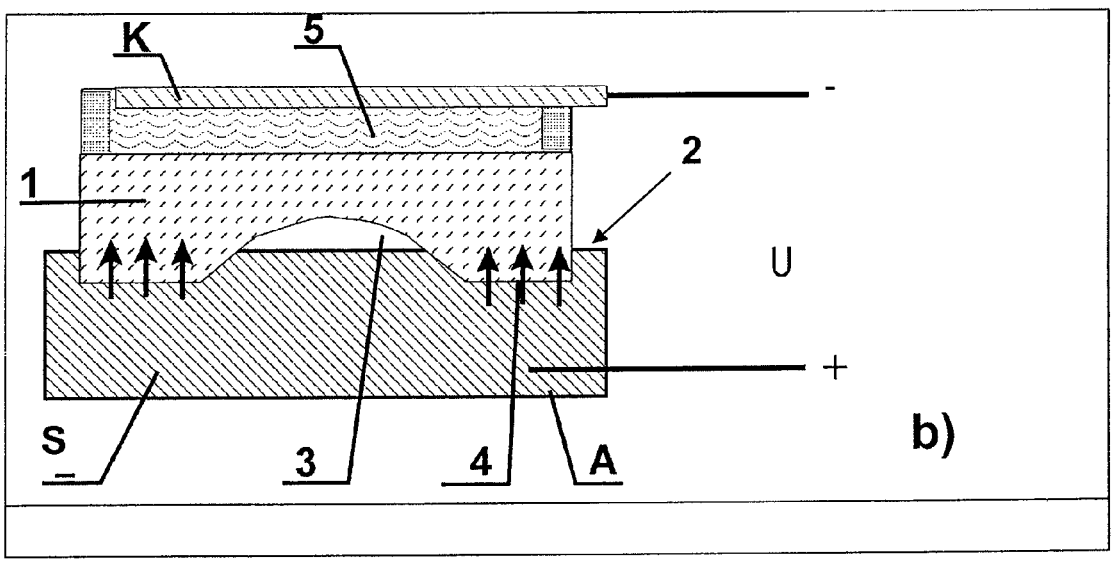

FIG. 1 shows a schematic setup for carrying the method according to the invention for surface removal of material on a copper substrate. For this purpose the tool 1, which itself is composed of a copper-ion-conducting material, preferably of copper rubidium chloride, lies on the substrate surface 2 of the substrate S. The side of tool 1 facing the substrate surface 2 is structured subject to a certain surface contour to be provided in the substrate surface 2. In the case of the preferred embodiment according to FIGS. 1a and b, for this purpose tool 1 is provided with a concave recess 3 which is surrounded by a plane peripheral edge 4. At the beginning of the material removal process, the peripheral edge 4 rests flat on the substrate surface 2. An electric potential difference is applied between the tool 1 and the substrate S in the manner shown in FIG. 1a, that is the rear side of the tool 1 becomes the cathode K and the substrate S becomes the anode A. As previously mentioned, copper rubidium chloride is especially suited as a material for tool 1, because at room temperature copper rubidium chloride is a very good ion-conductor for copper ions. Moreover, the material is very well suited to be a material for production of any number of workpiece surfaces as the material can be relatively easily obtained from both salts and melts at temperatures of approximately 250° C. On the other hand, below the melting point, the material has a hard, massive material structure. To produce a suitable tool, the material, which is present in a liquid molten mass, can be poured into a suitable master form from which the material can be in the form of a cooled molten mass. In this manner, the tool which is obtained is then used for local removal of material as part of a so-called electrochemical sinking process in which the tool side facing the substrate surface 2 rests on the cleaned, smooth copper substrate surface and an electrical voltage is applied between the ion-conducting tool 1 and the substrate S. It is only where areas touch that copper atoms can now separate from the metal of the substrate S and penetrate into the ion-conducting tool. As a result of this material transport, the tool 1 sinks further and further into the substrate surface 2 until the entire surface of the tool 1 is in contact with the substrate S. Following completion of the removal process and raising of the tool 1 from the now structured substrate surface, a reverse replication of the tool contour remains on the substrate S.

The copper removed during the electrochemical sinking process is applied to the rear cathode K. In order to counteract possible problems caused by the epitaxial growth of the copper on the cathode K, instead of a metallic conductive cathode K according to the embodiment of FIG. 1a, advantageously an ion-conducting electrolyte 5, according to the preferred embodiment of FIG. 1b, can be provided between the ion-conducting tool 1 and the anode A. The ion-conducting electrolyte 5 may be present in the form of a copper salt in solution, for example in water, or in another solvent or in a molten salt mass, for example in the form of an organic salt, with the electrolyte 5 present in liquid form being correspondingly encapsulated at the rear side of the tool 1, with cathode K being a peripheral surface of the electrolyte encapsulation. The electrolyte 5 acts as a buffer, and as a reservoir for the copper ions, with the copper ions being accepted or released by the electrolyte 5 depending on the electrical potential.

The method according to the invention is especially suitable for replication of laser mirrors which can preferably be produced from mono-crystalline copper.

Equally interesting, however, is using the method according to the invention for planing and polishing substrate surfaces, such as for example copper surfaces. In this case, it is necessary that the tool composed of copper rubidium chloride has a smooth, planar tool surface which can be placed on the substrate surface of the copper substrate. In such a case, it is so-called dry CMP, that is chemo-mechanical polishing, which preferably can be used to produce copper metalizations on silicon wafers. It should be noted that the method of the invention can also be applied to substrate surfaces, and substrates, composed for example of silver or silver-copper alloys which are equally able to conduct metal ions.

In order to explain planing a substrate surface using the method according to the invention, a so-called damascene process is described with reference to FIGS. 2a and b. In a damascene process, a copper layer projecting over the metalized wafer has to be removed. For this purpose, a tool 1 with a planar tool surface is placed and pressed onto a metalized wafer. In the described case, the wafer consists of a silicon substrate, of a dielectric layer 6 applied thereon, which is structured and coated with a thin tantalum (Ta) layer 7, which for its part is projected over by a copper layer 8 which has to be planed.

Figure 2:
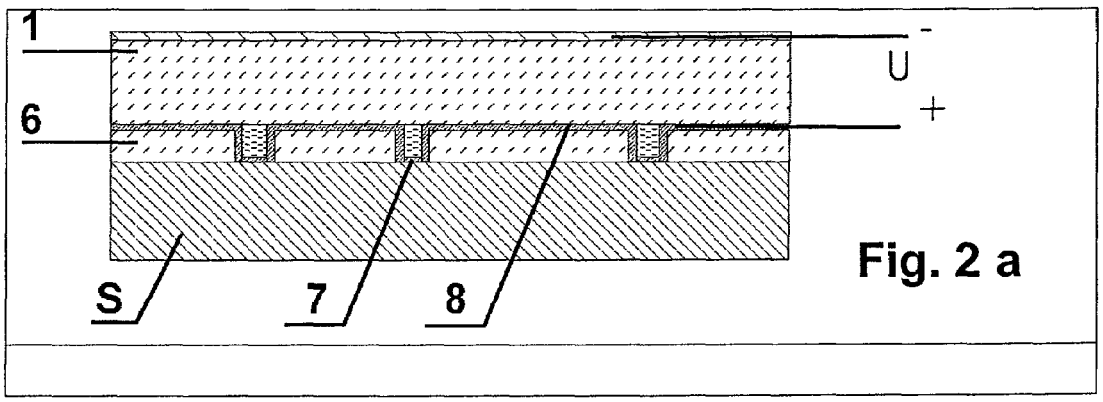
FIGS. 2a and b show a preferred embodiment to illustrate planing of a surface substrate by means of the process according to the invention.
Figure 2:
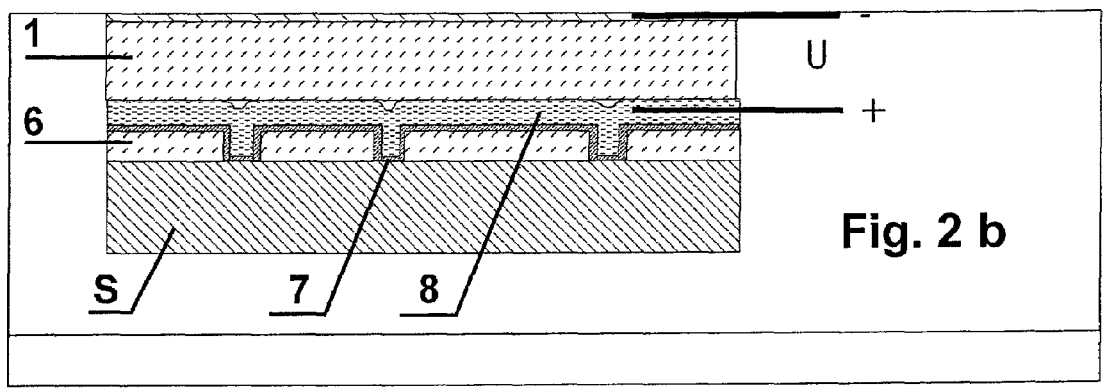

This case is shown in FIG. 2a. An electrical voltage is applied between the metalized surface of the structured wafer, that is between the copper layer 8 and the ion-conducting tool, in such a manner that the copper ions in the contact region between the copper layer 8 and the tool 1 enter the ion-conducting tool and are deposited on the rear side thereof, i.e. the cathode side. Thus during the material removal process, which is similar to an etching process, an electrical current flows between the surface of the structured wafer and the anode of the ion-conducting tool 1.

The process of electrochemical removal of the copper lasts until the copper is completely removed in the contact regions and the ion-conducting surface of the tool contacts the barrier layer, in the form of a tantalum layer 7, lying beneath the copper. Thus the etching process, and the material removal process, comes to a stop and further etching of the copper (copper damascene method) is interrupted. This process is indicated by a drop in the flow of the electrical current through the ion-conducting tool, thus permitting recognizing the end of the etching process.

This situation is made more apparent in FIG. 2b in which the ion-conducting tool 1 rests plane on the structured, dielectric layer 6 coated with the tantalum layer 7.

Due to the relatively high ionic conductivity of the copper rubidium chloride of which the tool 1 is composed, the process can with certainty also be conducted at room temperature of 20-25° C. However, it is advantageous to conduct the removal process at approximately 80° C. raised by heating as ionic conductivity is better at this, compared to room temperature, raised temperature.

The present tantalum layer 7 is also suitable just as for example a tantalum nitride layer, as a barrier layer 8 and can be removed in the same manner as possibly projecting thin copper remains due to the inhomogeneities in the layer thickness of the copper by means of subsequent sputter etching or by tantalum polishing.

A special advantage of the method according to the invention is that it is possible to produce a completely planar, and even, substrate surface in the sense of global planing without any indentations, and any dishing, in the surface without using abrasive or polishing agents. As a result, no additional particle remains are left on the substrate surface. Furthermore, mechanical shear stress of the tool surface caused by a conventional polishing process can also be completely prevented. Mechanical shear stress can be extremely disadvantageous for porous dielectric layers (low-k dielectrics).

Should, due to prolonged use of the ion-conducting tool, metal, foreign to the tool, collects inside the tool, the tool can be returned to its original state by placing the tool on a metalized substrate and reversing the polarity of the electric voltage so that metal parts foreign to the tool are released by means of the ionic conductivity of the tool. In this context, conditioning the tool surface is described.

Moreover, as it cannot be ruled out that in the course of time the ion-conducting material of the tool may nonetheless change chemically on the surface as soon as, for example, the tool comes into contact with an anode that is not composed of copper. It is especially useful to select an ion conductor that can be temporarily melted after use such as is the case for example with copper rubidium chloride. In this manner, a chemically identical surface of the ion-conducting tool can be ensured at any time and moreover surface flaws, for example scratches, can be remedied.

Another possible application of the method according to the solution is using Pyrex® (which is a registered trademark of Corning, Inc.) glass, which is known to be a low expansion borosilicate glass, as the tool material, because at temperatures of 300 to 400° C., Pyrex glass is an ion conductor for alkali ions. Another interesting property of Pyrex glass is that, on the one hand, it can bond with silicon by means of anodic bonding, because, in contact with silicon, an electrochemical reaction occurs by means of anodic oxidation. On the other hand, Pyrex is able to accept ions, for example silver ions, by means of diffusion whereby the electrical conductivity of Pyrex glass can be selectively set. Due to these properties of Pyrex glass, the method according to the invention can be employed for producing optically effective structures in the micro and nano range. For example, if a silver layer is vapor deposited on a Pyrex glass wafer, which then acts as a substrate and on whose silver layer then a second structured Pyrex glass wafer is placed which then serves as the tool, the silver lying on the substrate can be removed, and completely removed, in the contact regions with the Pyrex tool by application of an electrical voltage between the substrate and the structured tool. In an actually conducted experiment regarding this, the following process parameters were selected: T=400° C., electrical voltage 100V, current flow 2 mA/cm$^2$, process duration approximately. 200 sec., with an Ag layer thickness of approximately 200 nm.

Depending on the structuring of the tool composed of Pyrex glass, micro and nano structures can be produced on the wafer level and correspondingly replicated, thereby opening, for example, the possibility of replication of optical metallic grid structures with line widths and line spaces of a dimension of 20 nm. or larger. Such type grid structures can be used not only as transmission grids but even as optical polarizers.

Replication of three-dimensional silver films on such type Pyrex glass substrates can also be utilized to produce so-called gradient index lenses. For this purpose, an electrical voltage, poled in reverse to the above application, is applied between the Pyrex glass, on which a silver layer is to be vapor deposited, and the correspondingly structured Pyrex glass tool in such a manner that the silver is able to diffuse into the glass substrate and thus complex diffusion profiles form inside the Pyrex glass substrate which ultimately can be utilized as gradient index lenses.

The aforedescribed variants of the method of the invention describe material removal processes and material deposition processes in which neither foreign materials are formed nor corresponding process materials need to be provided for carrying the process successfully.

Figure 3:
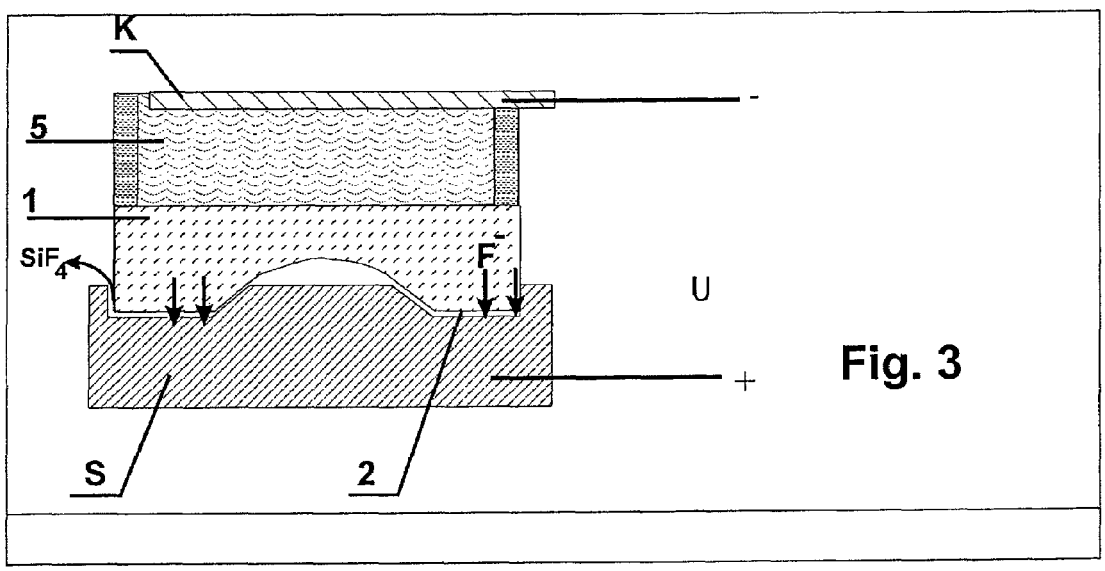
FIG. 3 shows a preferred embodiment for local removal of material by means of an anionic ion conductor for fluoride ions.

If instead of the aforedescribed cationic ion conductors, so-called anionic ion conductors are used as the tool material, such as for example $CaF_2$, $LaF_3$ or also $ZrO_2$, it opens the possibility of reactively etching certain substrate materials on their surfaces and in this manner effectively replicate the substrate surface locally which may be copper, silver or a copper silver alloy. Similar to the aforedescribed application examples, the structured tool surface of the tool, which now is composed of anionic ion conductors, is placed on the substrate surface, which preferably is the surface of a silicon wafer. When an electrical potential is applied between the anionic ion conductor of the tool and the silicon wafer, if an ion conductor containing fluorine is employed, the F ions flow out of the ion-conducting tool to the silicon wafer surface, which is in contact with the ion-conductor and are released there as fluorine atoms, and fluorine molecules. These very reactive products immediately react with the silicon to form $SiF_4$, which is gaseous and is able to diffuse from the peripheral surface. This situation is shown in FIG. 3 in which the structured, fluorine-containing surface of the tool 1 rests on the silicon wafer S, with the tool 1 being provided on the rear side with an electrolyte 5 which for its part is connected to a cathode K. Due to the potential difference applied between the tool 1 and the silicon substrate S, fluorine ions flow to the surface of the tool 1 facing the silicon substrate S at which the fluorine ions are released as the reactive gas $F_2$ and react in the presence of the surface silicon to form $SiF_4$.

The ionic conductivity of the ion-conducting material of the tool and the electrical conductivity of the silicon wafer S can moreover be increased if the temperature level is raised to temperatures between 200 and 300° C. In this manner, the reactive etching process on the silicon surface can be distinctly improved.

Moreover, to support the removal of the gaseous reaction products forming between the tool 1 and the silicon surface 2, it is useful to temporarily, preferably periodically, raise the tool 1 a little from the substrate surface and return it. In this manner, the gaseous reaction products are able to escape laterally. This can also be achieved, for example, by in addition ultrasound or large-sound acting on the tool.

In order to ensure prevention of depletion of fluoride ions at the ion-conducting tool 1, the cathode side should be provided with a fluoride-containing molten salt as a fluorine reservoir, which according to the preferred embodiment of FIG. 3, is provided in the form of an electrolyte 5, thereby fundamentally opening the possibility of producing refractive or also diffractive lenses composed of silicon and replicating them. By using an oxygen-conducting material, for example zirconium oxide ($ZrO_2$) as the tool material, completely analogously to structuring silicon, also materials such as graphite or diamond can be structured three-dimensionally, and replicated three-dimensionally.

Figure 4:
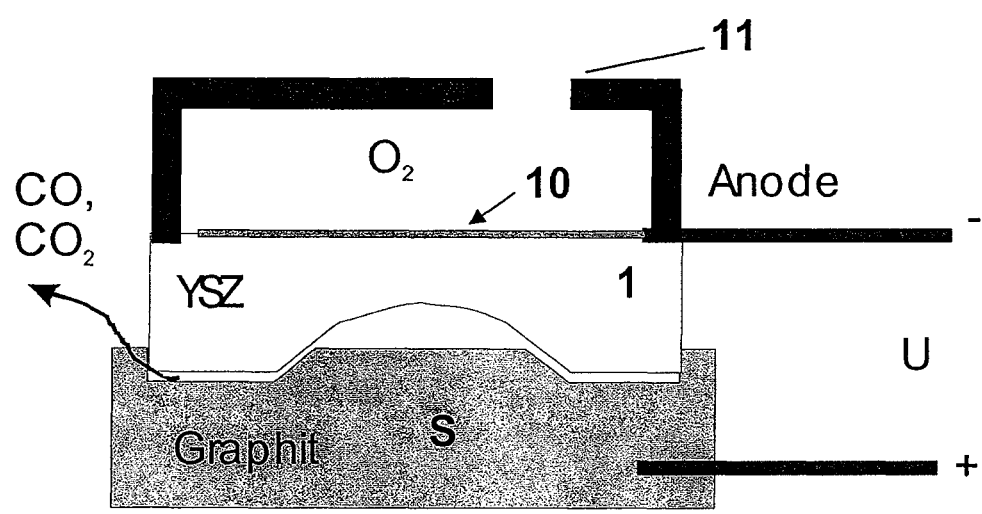
FIG. 4 shows a preferred embodiment for local removal of material by means of an anionic $ZrO_2$ ion conductor.

Especially suited as the tool material is an yttrium-stabilized zirconium oxide ceramic (YSZ). The simplest setup is shown in FIG. 4 in which a suitably shaped tool 1 composed of YSZ is placed on a substrate surface 2 composed of graphite. The ion-conductive ceramic is coated on the rear side with a thin, electrically conducting layer 10, in this case of platinum, which nonetheless remains sufficiently permeable for oxygen.

After placing the tool 1 on the graphite, a voltage U is applied between the graphite and the rear side of the tool. In order to obtain sufficient ionic conductivity of the ceramic, it is necessary to heat the entire setup to a temperature of approximately 400° C. in an oxygen-containing atmosphere.

In these conditions, the graphite, on the one hand, remains stable to oxygen but the YSZ ceramic of the tool 1 possesses sufficient conductivity and the graphite is sufficiently reactive to start an etching process. The oxygen atmosphere $O_2$ ensures the actual supply of oxygen and prevents formation of depletion zones in the ion conductor. In these conditions, with a voltage of 80V and a current density of approximately 2 $mA/cm^2$, it is possible to obtain an etching rate of 12-30 nm/min. However, a distinctly higher etching rate can be obtained if a higher process temperature is used. At temperatures above 500° C., however, it is absolutely necessary to protect the graphite against the oxygen, and to insulate it. In this case, the YSZ tool 1 is connected on the rear side to a ceramic lead 11, the inner volume of which is impinged with an oxygen-containing atmosphere. On the other hand, the space outside this pipe is purged with an inert gas, nitrogen or argon, thereby largely preventing the undesired reaction of the graphite with the oxygen remains.

To facilitate the removal of the reaction products, CO or $CO_2$, especially in the case of large surface objects, a vertical vibration motion such as for example ultrasound or large-sound can be introduced supportively.

This method may be of particular interest with regard to producing or replicating glass carbon compression molding dies. These tools are especially suited as mold inserts in blank compression processes for lenses for materials with a high melting point, such as silica glass.

LIST OF REFERENCES

1 Tool
2 Substrate surface
3 Concave-shaped recess
4 Peripheral edge
5 Electrolytes
6 Dielectric
7 Tantalum layer
8 Copper layer
S Substrate
A Anode
K Cathode
10 Platinum layer
11 Ceramic line

What is claimed is:

1. A method of treating a surface of an electrically conductive substrate comprising:
   contacting at least one surface of the electrically conductive substrate with a tool comprising copper rubidium chloride which is conductive of metal ions;
   applying an electrical potential for producing an electrical potential gradient between the surface of the electrically conductive substrate and the tool to cause the metal ions to flowthrough the tool wherein the electrical potential gradient causes the metal ions to flow from the surface of the electrically conductive substrate to be deposited on the tool or to flow from the tool to be deposited onto the surface of the electrically conductive substrate; and
   separating the tool from contact with the surface of the electrically conductive substrate.

2. The method according to claim 1, wherein:
   the tool is pressed under force onto the substrate surface.

3. The method according to claim 1, wherein:
   the tool has a side facing the substrate surface and a side facing away from the substrate surface; and
   the electrical potential is applied between the substrate surface and the side of the tool facing away from the substrate surface.

4. The method according to one of the claim 3, comprising:
   a reservoir of a liquid electrolyte which accepts or releases the metal ions disposed at the side of the tool facing away from the substrate surface.

5. The method according to claim 1, comprising:
   contacting a smooth plane tool surface on the substrate surface; and
   the electrical potential is applied between the tool and the substrate to cause metal ions to emerge from the substrate surface and to be accepted by the tool to initiate a material removal process from the substrate surface.

6. The method according to claim 1, wherein:
   the tool includes a structured surface on the substrate surface, and further comprises applying the electrical potential to cause metal ions to flow from the substrate surface in areas in which the tool contacts the substrate surface to be accepted by the tool to produce a locally confined material removal process causing the substrate surface to be structured in accordance with the structured surface.

7. A method of treating a surface of an electrically conductive substrate comprising:
   contacting the surface of the electrically conductive substrate with at least one surface of a tool comprising copper rubidium chloride which is conductive of metal ions flowing to or from the electrically conductive substrate; and applying an electrical potential for producing an electrical potential gradient between the electrically conductive substrate and the tool to cause the metal ions to flow to the surface of the electrically conductive substrate from the at least one surface of the tool to form a metallic layer on the surface of the electrically conductive substrate or to cause the metal ions to flow from the surface of the electrically conductive substrate through the tool to remove metal ions from the surface of the electrically conductive substrate; and separating the tool from contact with the surface of the electrically conductive substrate to reveal metal deposited on the surface of the electrically conductive substrate or removal of metal from the surface of the electrically conductive substrate.

8. The method of claim 7 wherein the surface of the electrically conductive substrate contacting the at least one surface of the tool is modified by the flow of the ions through the tool to or from the surface of the electrically conductive substrate.

9. The method of claim 1 wherein the at least one surface of the electrically conductive substrate is modified by the flow of the ions through the tool to or from the electrically conductive substrate where surface contact of the tool with the electrically conductive substrate occurs.

10. The method in accordance with claim 1 comprising using the tool to process another substrate.

11. The method in accordance with claim 7 comprising using the tool to process another substrate.

12. The method in accordance with claim 8 comprising using the tool to process another substrate.

13. A method of treating a surface of an electrically conductive substrate comprising:

contacting at least one surface of the electrically conductive substrate with a tool comprising copper rubidium chloride which is conductive of metal ions and disposing an ion conducting liquid electrolyte between the tool and an anode of a power source;

applying an electrical potential from the power source for producing an electrical potential gradient between the surface of the electrically conductive substrate and the tool to cause the metal ions to flow between the tool and the electrically conductive substrate via the electrolyte wherein the electrical potential gradient causes the metal ions to flow from the surface of the electrically conductive substrate via the electrolyte to be deposited on the tool or to flow via the electrolyte from the tool to be deposited onto the surface of the electrically conductive substrate; and separating the tool from contact with the surface of the electrically conductive substrate; and wherein the liquid electrolyte is provided from a reservoir adjacent the tool.

14. The method according to claim 13, wherein:
the tool is pressed under force onto the substrate surface.

15. The method according to claim 13, wherein:
the tool has a side facing the substrate surface and a side facing away from the substrate surface; and
the electrical potential is applied from the power source between the substrate surface and the side of the tool facing away from the substrate surface.

16. The method according to claim 13, comprising:
contacting a smooth plane tool surface on the substrate surface; and
the electrical potential is applied from the power source between the tool and the substrate to cause metal ions flowing via the electrolyte to be accepted by the tool to initiate a material removal process from the substrate surface.

17. The method according to claim 13, wherein:
the tool includes a structured surface on the substrate surface, and further comprises applying the electrical potential from the power source to cause metal ions to flow from the substrate surface in areas in which the tool contacts the substrate surface via the electrolyte to be accepted by the tool to produce a locally confined material removal process causing the substrate surface to be structured in accordance with the structured surface.

18. The method according to claim 13, comprising:
providing a smooth planar tool surface or a smooth curved tool surface to produce light reflecting surfaces.

19. The method of claim 13 wherein the at least one surface of the electrically conductive substrate is modified by the flow of the ions through the electrolyte where a surface contact of the tool controls the electrically conductive substrate occurs.

20. The method in accordance with claim 13 comprising using the tool to process another substrate.

* * * * *